United States Patent
Mandelman et al.

(10) Patent No.: US 6,479,368 B1
(45) Date of Patent: *Nov. 12, 2002

(54) METHOD OF MANUFACTURING A SEMICONDUCTOR DEVICE HAVING A SHALLOW TRENCH ISOLATING REGION

(75) Inventors: Jack A. Mandelman, Stormville, NY (US); Mutsuo Morikado, Yokohama (JP); Herbert Ho, New Windsor, NY (US); Jeffrey P. Gambino, Gaylordsville, CT (US)

(73) Assignees: Kabushiki Kaisha Toshiba, Kanagawa (JP); International Business Machines Corp., Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 8 days.

(21) Appl. No.: 09/033,067

(22) Filed: Mar. 2, 1998

(51) Int. Cl.[7] .............................. H01L 21/76
(52) U.S. Cl. ................. 438/435; 438/424; 438/443; 438/444; 438/445
(58) Field of Search ................ 438/424, 435, 438/439, 443, 444, 445, 700, 702, 436, 437, 221

(56) References Cited

U.S. PATENT DOCUMENTS

| | | | | |
|---|---|---|---|---|
| 4,533,430 A | | 8/1985 | Bower | 156/643 |
| 4,534,826 A | * | 8/1985 | Goth et al. | 438/421 |
| 4,549,927 A | * | 10/1985 | Goth et al. | 156/643 |
| 4,671,970 A | | 6/1987 | Keiser et al. | 427/93 |
| 4,839,306 A | * | 6/1989 | Wakamatsu | 438/424 |
| 4,849,369 A | | 7/1989 | Jeuch et al. | 437/43 |
| 4,892,614 A | * | 1/1990 | Chapman et al. | 438/425 |
| 4,945,069 A | | 7/1990 | Carter | 437/67 |
| 4,994,409 A | | 2/1991 | Yoon et al. | 437/164 |
| 5,017,506 A | | 5/1991 | Shen et al. | 437/52 |
| 4,348,905 A | * | 9/1994 | Kenney | 438/247 |
| 5,387,539 A | | 2/1995 | Yang et al. | 437/67 |
| 5,472,904 A | * | 12/1995 | Figura et al. | 438/426 |
| 5,498,564 A | | 3/1996 | Geissler et al. | 437/52 |
| 5,529,952 A | | 6/1996 | Smith et al. | 437/184 |
| 5,593,912 A | | 1/1997 | Rajeevakumar | 437/52 |
| 5,643,823 A | * | 7/1997 | Ho et al. | 438/421 |
| 5,786,276 A | * | 7/1998 | Brooks et al. | 238/724 |
| 5,940,717 A | * | 8/1999 | Rengarajan et al. | 438/435 |

OTHER PUBLICATIONS

S. Wolf et al. "Silicon Processing for the VLSI Era", vol. 1–Process Technology, p. 428.*

* cited by examiner

Primary Examiner—Carl Whitehead, Jr.
Assistant Examiner—Christy Novacek
(74) Attorney, Agent, or Firm—Banner & Witcoff Ltd.

(57) ABSTRACT

A method of manufacturing a semiconductor device, in which the depth of a divot in a shallow trench isolation can be decreased. The method comprises forming a trench in a semiconductor substrate, for isolating elements, forming a nitride film on a surface of the trench, depositing mask material on an entire surface of the semiconductor substrate, filling the trench with the mask material, etching the mask material until a surface level of the mask material in the trench falls below the surface of the semiconductor substrate, removing an exposed upper portion of the nitride film on the surface of the trench, removing the mask material from the trench, filling the trench with element-isolating material, thereby forming an element-isolating region, and forming a transistor in an element region isolated from another element region by the element-isolating region.

11 Claims, 5 Drawing Sheets

METHOD OF MANUFACTURING A SEMICONDUCTOR DEVICE HAVING A SHALLOW TRENCH ISOLATING REGION

BACKGROUND OF THE INVENTION

The present invention relates to a method of manufacturing a semiconductor device, and more particularly to a method of manufacturing a semiconductor device, in which the depth of a divot in the shallow trench isolation can be controlled.

In a typical process of forming a shallow trench isolation (hereinafter referred to as "STI"), a nitride liner is formed on the thermally oxidized film on the surface of a shallow trench. The nitride liner is so formed to prevent oxidation of the silicon sidewall of the collar region of a deep storage trench. TEOS oxide is then deposited in the shallow trench by means of LPCVD. As a result, a STI is formed which isolates adjacent elements from one another.

As may be seen from FIG. 1, a nitride liner 1 is formed in a shallow trench in order to prevent oxidation of the silicon sidewall of the collar oxide region 4 of a deep storage trench 2. As shown in FIG. 1, the deep storage trench 2 is covered with an STI 3. Where the silicon sidewall of the collar oxide region 4 oxidized, a bird's beak of $SiO_2$ would grow to generate a stress and cause dislocation of silicon. The nitride liner laid on the bottom of the STI 3 acts as a barrier, which prevents oxygen from diffusing into the trench collar 4. Thus, the nitride liner greatly reduces the defects in silicon.

However, the STI nitride liner makes it easy for etchant to attack the near-top part of the trench and the near-corner part of the active layer in the wet etching which is performed later to remove the pad nitride film on the element regions. The nitride liner on the upper part of the STI is inevitably etched while the pad nitride film is being etched with hot phosphoric acid. A removing of the pad nitride film is typically accompanied by over-etching for 5 to 10 minutes.

The nitride liner on the upper part of the STI is etched by this over-etching, whereby a small recess known as "divot" is formed in the top edge of the STI. The divot exposes the oxide thermally grown on the sidewall of the shallow trench and the surface of the LPTEOS layer. The etchant invades the recess, etching the oxide during the etching of the pad oxide and gate-sacrificing oxide. Inevitably, the etchant deepens the divot toward the corners of the active region and expands the divot in the horizontal direction.

It is difficult to control this isotropic etching of the near-corner part of the active region. The off current therefore changes greatly, making it impossible to lengthen the charge-holding time. FIG. 2 is a schematic representation of the divot formed in the top of the STI. Numeral 10 in FIG. 2 indicates the divot expanded.

The off current depends upon the conductivity of the corner parts of the active region, due to the reduced width of the semiconductor device and also to the electric field concentrated at the corner parts of the active region. The off current is much influenced by the geometrical shapes of the corner parts and the area over which the corner parts overlap the gate conductor (i.e., word line). The overlapping area is determined by the depth of the divot formed on the STI upon completion of the etching of the pad oxide and gate-sacrificing oxide.

Experiments and model simulation have indicated that the threshold voltage (Vt) of a field-effect transistor decreases about 1 mV each time the depth of the divot increases one angstrom. FIG. 3 shows the results of the model simulation, and FIG. 4 shows the values actually measured.

Generally, the divot is observed to be 300 angstroms deep. The threshold voltage Vt which corresponds to the depth of 300 angstroms causes, as seen from FIG. 5, a change of more than three orders in the off current and increased incidence of retention time fails.

BRIEF SUMMARY OF THE INVENTION

An object of the present invention is to provide a method of manufacturing a semiconductor device, in which the depth of a divot in a shallow trench isolation can be decreased.

Another object of the invention is to provide a semiconductor device which is manufactured by such a method.

According to the present invention, there is provided a method of manufacturing a semiconductor device comprising the steps of: forming a trench in a semiconductor substrate, for isolating elements; forming a nitride film on a surface of the trench; depositing mask material on an entire surface of the semiconductor substrate to fill the trench with the mask material; etching the mask material until a surface level of the mask material in the trench falls below the surface of the semiconductor substrate; removing an exposed upper portion of the nitride film formed on the surface of the trench; removing the mask material from the trench; filling the trench with element-isolating material, thereby forming an element-isolating region; and forming a transistor in an element region isolated from another element region by the element-isolating region.

According to the present invention, there is provided a semiconductor conductor device which comprises: a semiconductor substrate; an element-isolating region formed by filling element-isolating material in a trench formed in the semiconductor substrate; and a transistor formed in an element region isolated from another element region by the element-isolating region, wherein a nitride film is provided on an entire surface of the trench except an upper part of the surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described in detail, with reference to the accompanying drawings.

FIGS. 6A to 6F are sectional views for explaining the method of manufacturing a semiconductor device according to one embodiment of the present invention.

Figure 6A:
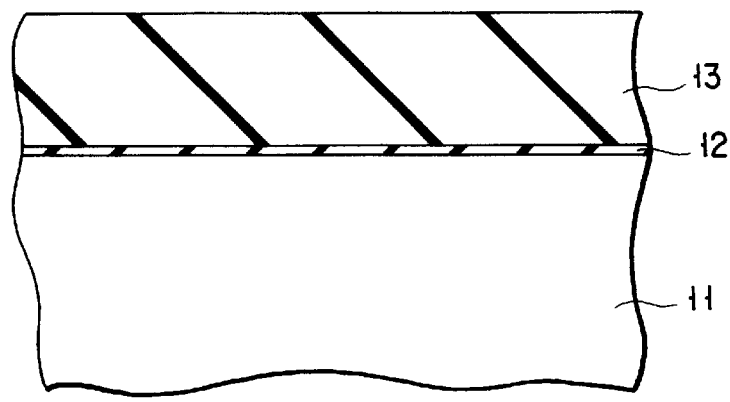
FIGS. 6A to 6F are sectional views for explaining a method of manufacturing a semiconductor device according to an embodiment of the invention.
Figure 6B:
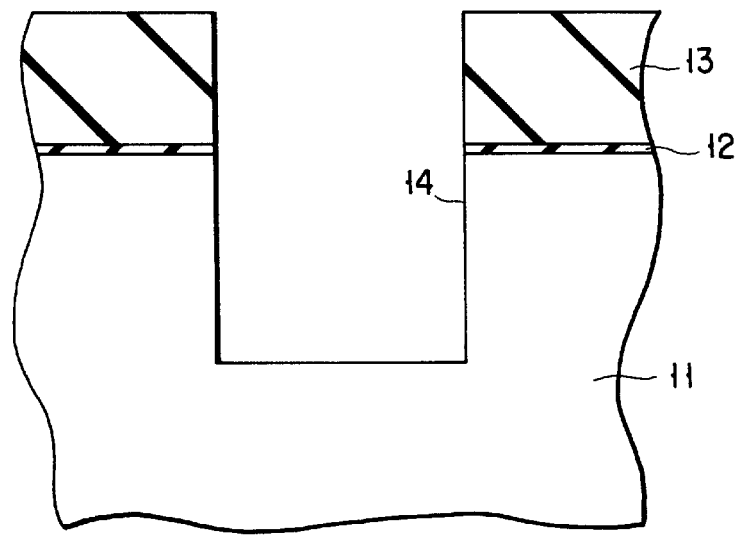

As shown in FIG. 6A, a pad oxide film 12 having a thickness of 80 angstroms is formed on a single-crystal silicon substrate 11. Further, a pad nitride film 13 having a thickness of 1,500 angstroms is formed on the pad oxide film 12. Next, the pad nitride film 13, pad oxide film 12 and single-crystal silicon substrate 11 are selectively etched by known anisotropic etching. A shallow trench 14 is thereby formed, which is 2,500 angstroms deep from the surface of the substrate 11 as illustrated in FIG. 6B.

Figure 6C:
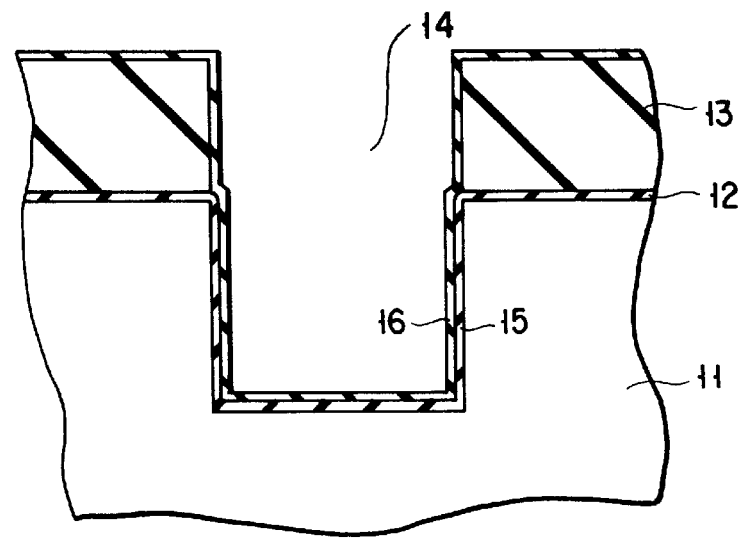

As shown in FIG. 6C, an oxide film 15 having a thickness of 100 angstroms is formed on the surface of the shallow trench 14 by performing thermal oxidation in an atmosphere containing $H_2O$ and $O_2$. Further, CVD is carried out by using a feed gas which is a mixture of $SiH_4$ and $NH_3$. As a result, a silicon nitride liner 16 having a thickness of 80 angstroms is formed on the entire surface of the structure, including the surface of the shallow trench 14.

Figure 6D:
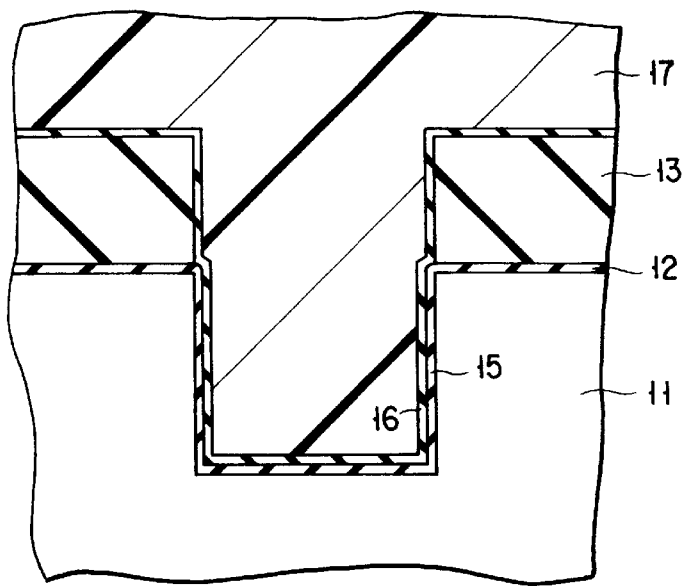

Thereafter, a resist 17 is coated to a thickness of 10,000 angstroms, filling the shallow trench 14 as shown in FIG. 6D. The resist 17 is, for example, AZ7500 (trade name).

Figure 6E:
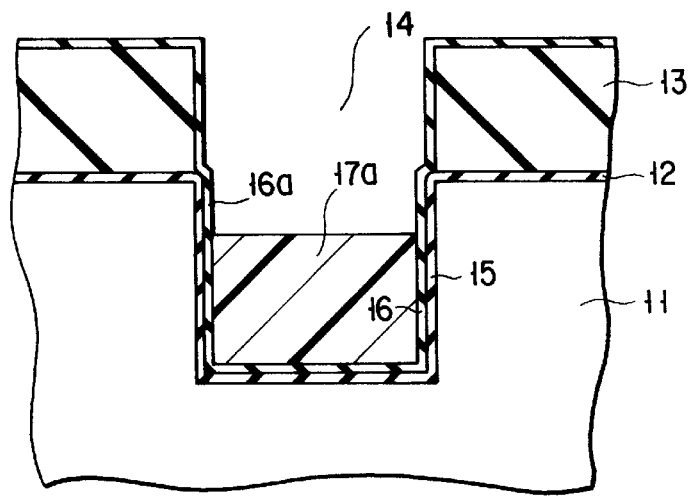

As shown in FIG. 6E, CDE (Chemical Dry Etching) is conducted on the structure in an atmosphere of $CF_4$—$O_2$ mixture (flow ratio: 50SCCM/300SCCM). The resist 17 is thereby etched to a depth of 1,000 angstroms from the surface of the silicon substrate 11. The tolerance of the thickness of the pad nitride film 13 may be controlled to ±10%, and that of the resist 17a remaining on the surface of the shallow trench 14 may be controlled to ±10% or less. If so, the resist 17a on the surface of the trench 14 will have such a thickness that its surface is at a distance of 415 to 1,585 angstroms from the surface of the silicon substrate 11. In other words, a part of the resist 17, which has such a thickness, is removed, whereby a part 16a of the silicon nitride liner 16 is exposed.

Figure 6F:
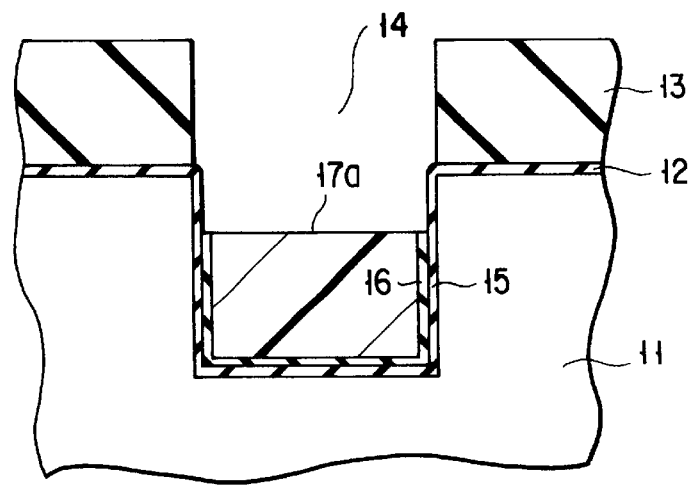

If the nitride liner 16 is relatively thin (5 nm or less), the CDE for removing the resist may remove the exposed part 16a of the nitride liner 16, too. If the nitride liner 16 is thicker (exceeding 5 nm), the part 16a of the nitride liner would not be removed simultaneously with the resist 17. In this case, the exposed part 16a of the nitride liner 16 is removed as shown in FIG. 6F, by performing additional CDE on the exposed part 16a of the nitride liner 16, which dose etch the resist 17.

That part 16a of the nitride liner 16 which is removed should be large enough to provide a barrier to prevent diffusion of oxygen when a deep trench collar is formed and to decrease the depth of the divot. In view of this it is desired that the lower edge of the part 16a be at a distance of 415 to 1585 angstroms from the surface of the silicon substrate 11.

After the silicon nitride liner 16a has been removed from the upper part of the surface of the shallow trench 14, the resist 17a is removed from the shallow trench 14 in its entirety. Thereafter, an ordinary process of manufacturing a semiconductor device is performed.

Figure 7:
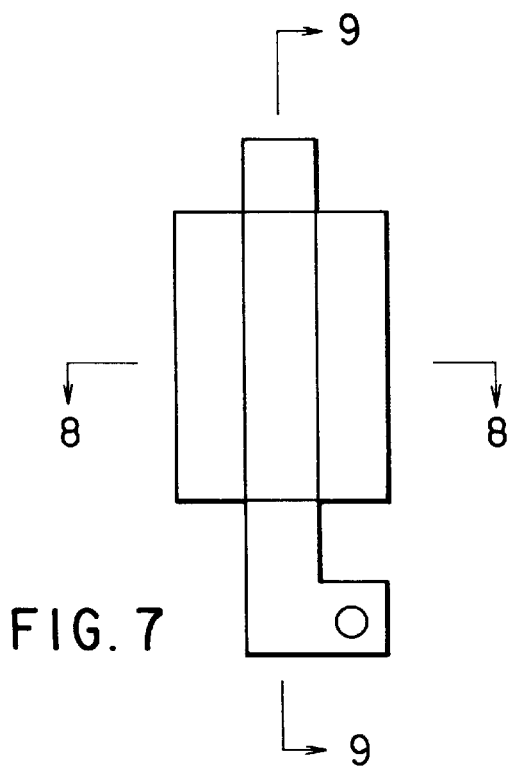
FIG. 7 is a plan view of the semiconductor device which has been manufactured by the method explained with reference to FIGS. 6A to 6F.
Figure 8:
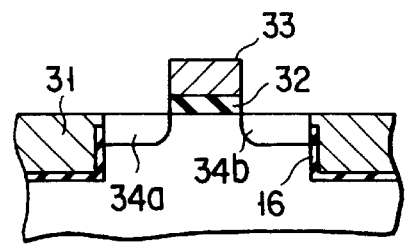
FIG. 8 is a sectional view taken along line 8—8 in FIG. 7.

That is, as shown in FIGS. 7 to 8, the shallow trench 14 is filled with TEOS oxide or the like, forming a STI 31. The STI 31 electrically isolates the element regions from each other. Parts of the pad nitride film 13 and the pad oxide film 12 are removed from the element regions thus isolated. A gate oxide film 32 is then formed, and a gate electrode 33 is formed on the gate oxide film 32. Further, ion implantation is carried out, forming a source region 34a and a drain region 34b. A MOSFET is thereby manufactured. No silicon nitride liner is exposed when the pad nitride film 13 is removed, and no divot would be formed at the time the silicon nitride liner is removed.

Figure 9:
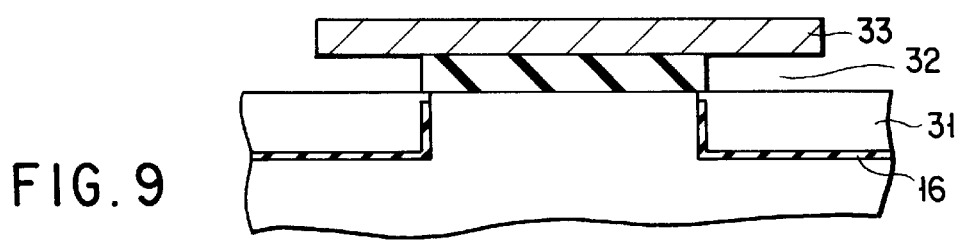
FIG. 9 is a sectional view taken along line 9—9 in FIG. 7.

FIG. 7 is a plan view of the MOSFET thus manufactured. FIG. 8 is a sectional view taken along line 8—8 in FIG. 7, and FIG. 9 is a sectional view taken along line 9—9 in FIG. 7.

Figure 1:
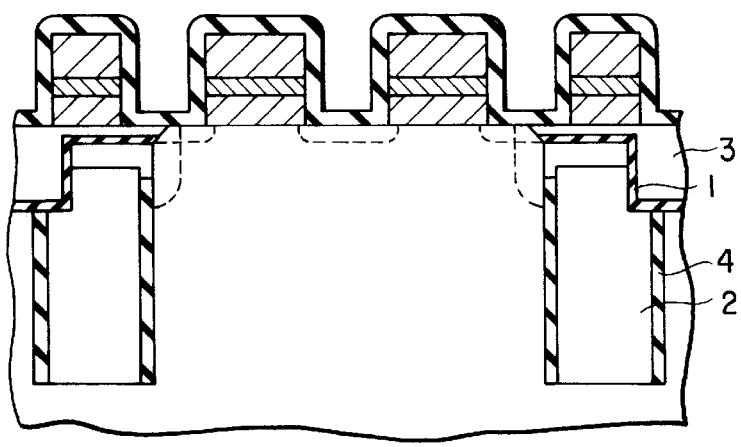
FIG. 1 is a sectional view of a semiconductor device in which the nitride liner on the bottom of the shallow trench isolation serves as a barrier which prevents diffusion of oxygen into the silicon layer provided on the side wall of the deep trench collar.
Figure 2:
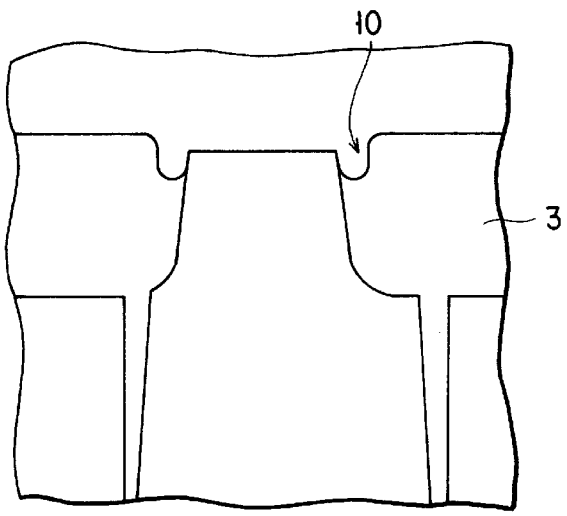
FIG. 2 is a schematic representation of the divot formed in the top of the shallow trench isolation of the device shown in FIG. 1.
Figure 3:
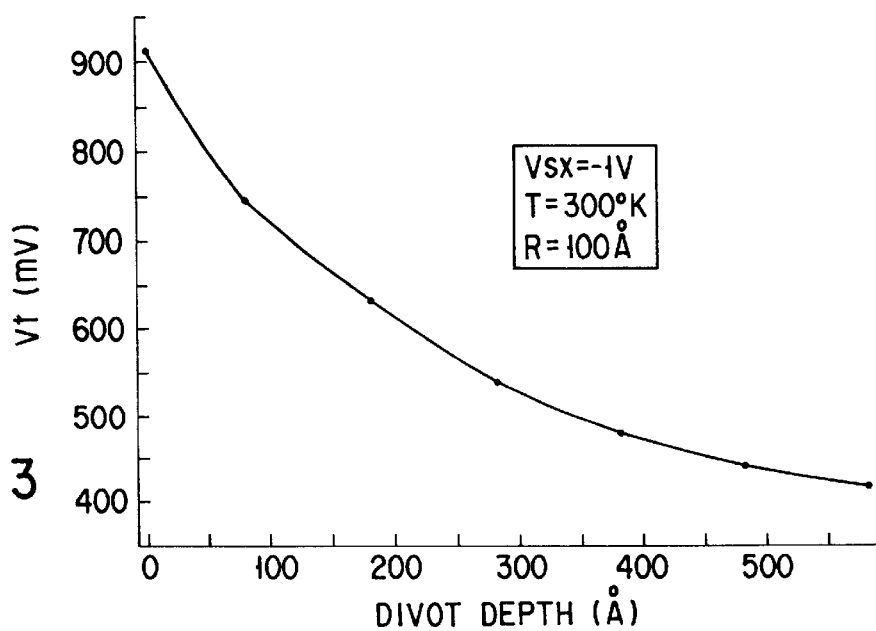
FIG. 3 is a graph representing the relationship between the depth of the divot and the threshold voltage, which has been obtained by model simulation.
Figure 4:
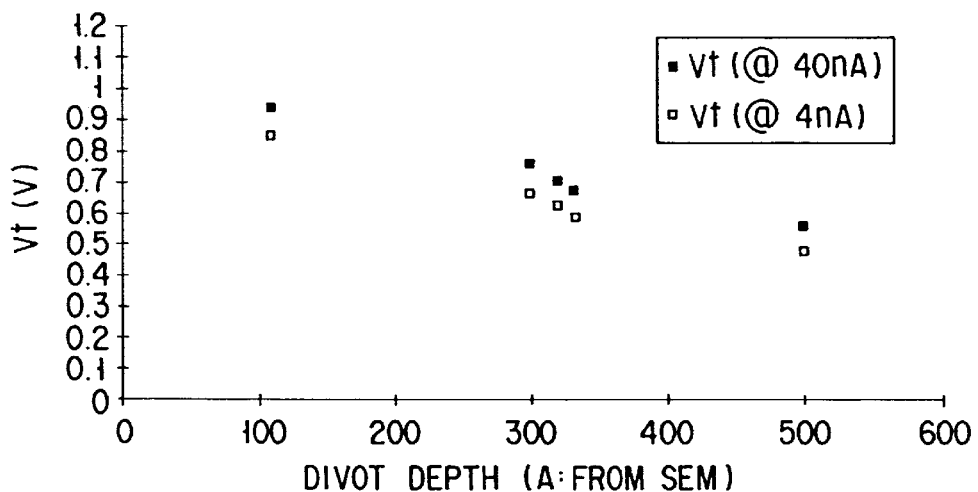
FIG. 4 is a graph illustrating the relationship between the depth of the divot and the threshold voltage, which has been obtained by actual measuring.
Figure 5:
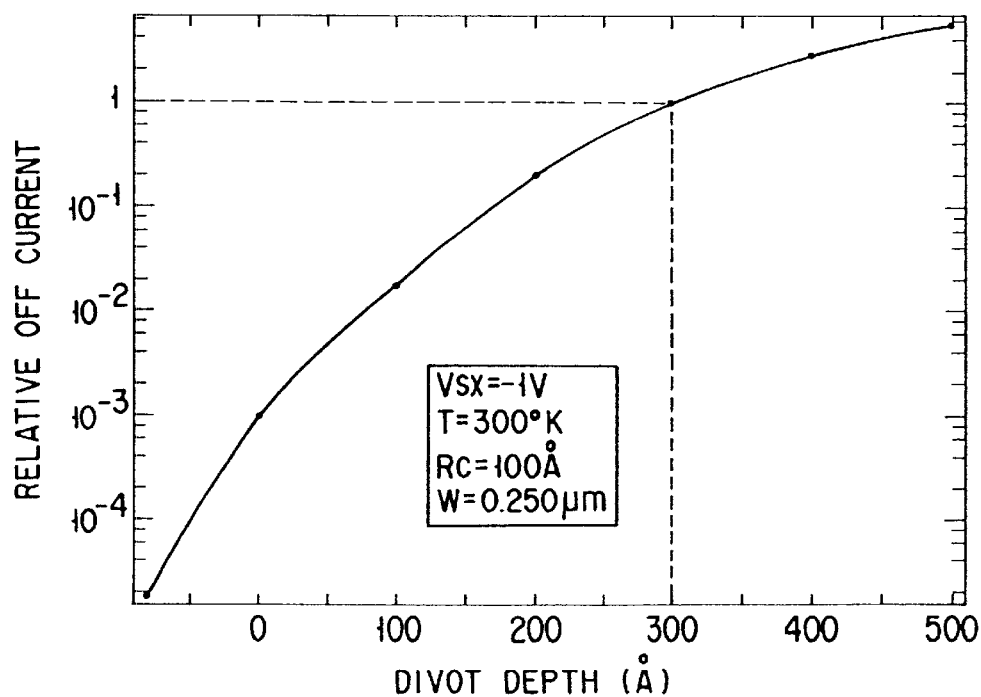
FIG. 5 is a graph depicting the relationship between the depth of the divot and the relative off current.
Figure 10:
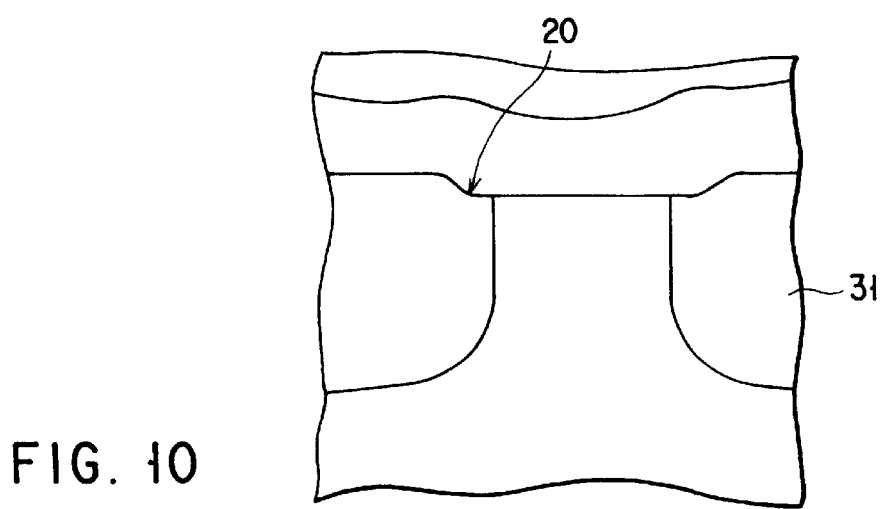
FIG. 10 is a schematic representation of a divot which is shallow in the top of the shallow trench isolation of the semiconductor device.

FIG. 10 is a schematic representation of the divot 20 which is small in the top of the STI of the MOSFET. The divot 20 is much smaller than the divot formed in the conventional device shown in FIG. 2.

As has been described, in the method according to the invention, the nitride liner on the upper part of the sidewall of the STI is removed prior to the ordinary process of manufacturing a semiconductor device. Therefore, no nitride liner is exposed when the pad nitride film is removed, and no divot would be formed when the pad nitride film is removed. The threshold voltage of the MOSFET does not greatly change. Nor does the off current change greatly. Nor will there occur increased incidence of retention time fails.

As described above, the nitride liner on the upper part of the STI is removed before oxidation is effected to form a gate-sacrificing oxide film and a gate oxide film. These oxide films therefore grow so thick that the parasitic current in their corner can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device having a shallow trench isolating region comprising the steps of:

forming a pad nitride layer on a semiconductor substrate;
    selectively etching the pad nitride layer and the semiconductor substrate to form a trench in the semiconductor substrate;

forming a nitride film on a surface of the trench;

depositing mask material on an entire surface of the semiconductor substrate so as to fill the trench with the mask material;

etching the mask material until an upper surface level of the mask material in the trench falls below the surface of the semiconductor substrate while removing the nitride film on the inner surface of the trench above the upper surface level of the mask material at the same time, a portion of the trench below the upper surface level of the mask material in the trench being entirely filled with said mask material, and a portion of the nitride film formed on the inner surface of the trench below the upper surface level of the mask material in the trench being entirely covered with said mask material and remaining on the surface of the trench;

etching off the entire mask material from the trench while the portion of the nitride film formed on the inner surface of the trench below the upper surface level of the mask material in the trench remains on the surface of the trench;

filling the trench with an insulating material, thereby forming an element isolating region;

etching off the pad nitride layer on the semiconductor substrate; and forming a transistor in an element region isolated from another element region by the element isolating region.

2. A method according to claim 1, wherein the mask material is a resist.

3. A method according to claim 1, wherein the step of etching the mask material until an upper surface level of the mask material in the trench falls below the surface of the semiconductor substrate comprises etching the mask material until the surface level of the mask material in the trench falls 415 to 1585 angstroms below the surface of the semiconductor substrate.

4. A method according to claim 1, wherein the mask material and the nitride film on the upper part of the surface of the trench are etched in an atmosphere of a $CF_4$—$O_2$ mixture using a chemical dry etching process.

5. A method according to claim 1, wherein the insulating material is TEOS oxide.

6. A method according to claim 1, wherein the nitride film has a thickness of 5nm or less.

7. A method according to claim 1, wherein the step of removing the pad nitride layer is performed after the step of filling the trench with the insulating material.

8. A method of manufacturing a semiconductor device having a shallow trench isolating region comprising the steps of:

forming a pad nitride layer on a semiconductor substrate;

selectively etching the pad nitride layer and the semiconductor substrate to form an element isolation trench in the semiconductor substrate;

forming a nitride film on a surface of the trench;

depositing mask material on an entire surface of the semiconductor substrate so as to fill the trench with the mask material;

etching the mask material to a depth below the surface of the semiconductor substrate while removing the nitride film on the inner surface of the trench above the upper surface level of the mask material at the same time, a portion of the trench below the upper surface level of the mask material in the trench being entirely filled with said mask material, and a portion of the nitride film formed on the inner surface of the trench below the upper surface level of the mask material in the trench being entirely covered with said mask material and remaining on the surface of the trench;

etching off the entire mask material from the trench while a second portion of the nitride film remains on the surface of the trench;

filling the trench with an insulating material, thereby forming an element isolating region;

etching off the pad nitride layer on the semiconductor substrate; and forming a transistor in an element region isolated from another element region by the element isolating region.

9. The method of claim 8, wherein the step of etching the mask material to a depth below the surface of the semiconductor substrate comprises etching the mask material until the surface level of the mask material in the trench falls 415 to 1585 angstroms below the surface of the semiconductor substrate.

10. The method of claim 8, wherein the step of removing the pad nitride layer is performed after the step of filling the trench with an insulating material.

11. The method of claim 10, wherein the step of etching the mask material to a depth below the surface of the semiconductor substrate comprises etching the mask material until the surface level of the mask material in the trench falls 415 to 1585 angstroms below the surface of the semiconductor substrate.

* * * * *